United States Patent
Jensen et al.

(10) Patent No.: US 6,315,249 B1
(45) Date of Patent: Nov. 13, 2001

(54) SYSTEM FOR MANAGING CABLES FOR A RACK-MOUNTED COMPUTER SYSTEM

(75) Inventors: Ralph Warren Jensen; David Scott Thornton; Richard Steven Mills, all of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/474,202

(22) Filed: Dec. 29, 1999

(51) Int. Cl.[7] .................................................. F16L 3/06
(52) U.S. Cl. .............................. 248/65; 248/68.1; 248/73; 248/49; 248/71; 248/74.2
(58) Field of Search ...................... 248/65, 68.1, 73, 248/49, 71, 74.2

(56) References Cited

U.S. PATENT DOCUMENTS

| | | | |
|---|---|---|---|
| D. 318,269 | | 7/1991 | Hassel et al. .................. D13/155 |
| D. 336,421 | * | 6/1993 | Grubicy et al. .................. D8/356 |
| D. 363,701 | | 10/1995 | Paquette et al. .................. D13/154 |
| D. 427,051 | * | 7/2000 | Lodi ............................... D8/395 |
| D. 432,405 | * | 10/2000 | Lodi ............................... D8/395 |
| 3,575,447 | * | 4/1971 | Merkle ............................ 285/248 |
| 3,910,536 | * | 10/1975 | Sharp et al. .................... 248/68 R |
| 4,353,518 | | 10/1982 | Taylor et al. ...................... 248/60 |
| 4,375,879 | | 3/1983 | Kojima et al. .................... 248/73 |
| 4,579,310 | * | 4/1986 | Wells et al. ..................... 248/544 |
| 4,805,856 | | 2/1989 | Nicoli et al. .................... 248/74.3 |
| 5,018,052 | | 5/1991 | Ammon et al. ................... 361/428 |
| 5,093,887 | | 3/1992 | Witte ............................. 385/135 |
| 5,131,613 | | 7/1992 | Kamiya et al. .................. 248/74.3 |
| 5,149,277 | | 9/1992 | LeMaster ......................... 439/207 |
| 5,216,579 | | 6/1993 | Basara et al. .................... 361/383 |
| 5,224,674 | * | 7/1993 | Simons .......................... 248/68.1 |
| 5,460,441 | | 10/1995 | Hastings et al. ................... 312/298 |
| 5,571,256 | | 11/1996 | Good et al. ........................ 211/26 |
| 5,626,316 | | 5/1997 | Smigel et al. ................... 248/68.1 |
| 5,639,049 | | 6/1997 | Jennings et al. ................. 248/74.2 |
| 5,655,738 | | 8/1997 | Ragsdale et al. ................. 248/68.1 |
| 5,726,866 | | 3/1998 | Allen .............................. 361/816 |
| 5,765,786 | | 6/1998 | Gretz .............................. 248/68.1 |
| 5,890,602 | * | 4/1999 | Schmitt .......................... 211/13.1 |
| 5,893,539 | | 4/1999 | Tran et al. ...................... 248/68.1 |
| 6,070,742 | * | 6/2000 | McAnally et al. .................. 211/26 |

OTHER PUBLICATIONS

"AMP Introduces WIMS for Flexible, Modular Cable Management," Nov. 6, 1996, 2 pages, http://www.amp.com/fiberoptics/wims.html.

"*Cable Management Glossary of Terms*," 2 pages, http://www.tritelchicago.com/equipment/data/glossary.html.

\* cited by examiner

*Primary Examiner*—Leslie A. Braun
*Assistant Examiner*—Steve Marsh
(74) *Attorney, Agent, or Firm*—Baker Botts L.L.P.

(57) ABSTRACT

A cable management system (10) is disclosed for coupling and retaining cables (16) for rack-mounted electronic components. The cable management system (10) includes a cable arm (12) that can pivot between an extended position and a collapsed position to accommodate movement in the rack-mounted component. Coupled to the cable arm are cable retainers (14). Each cable retainer includes a platform (46) and prongs (42). Each prong includes a stem (48) and a tapered projection (54). The combination of the platform (46), and the stem (48) and tapered projection (54) of adjacent prongs (42) forms a cavity for receiving a cable (16). The cable arm includes a number of slots in the supports of the cable arm for receiving latches, locks, or other fasteners of the cable retainer (14) for coupling the cable retainer (14) to the cable arm (12).

20 Claims, 6 Drawing Sheets

SYSTEM FOR MANAGING CABLES FOR A RACK-MOUNTED COMPUTER SYSTEM

TECHNICAL FIELD OF THE INVENTION

The present disclosure relates generally to cable management systems for rack-mounted computer systems and, more particularly, to cable retainers for use with cable arm assemblies for rack-mounted computer systems.

BACKGROUND OF THE INVENTION

Electronic systems, such as computer systems, stereo systems, and video systems, may be mounted in rack structures. These rack structures enable the computer or other electronic component to be mounted vertically, preseving floor space. Individual components are mounted in a rack structure using slides that attach to the rack. The individual components can then be slid into and out of the rack. In this manner, the individual components can be accessed for repairing the unit, providing upgrades, configuring the unit, connecting the unit to other components, and other tasks.

The components of a computer system that are often included in a rack system are servers, other computers, and direct access storage devices such as disk drives and RAID subsystems. Other components of rack-mounted electronic systems include amplifiers, CD players, DVD players, radio tuners, VCRs, and televisions. Access to components is provided by the slideable structure attached to the internal frame portion of the rack structure. In this way, components can be moved to a forwardly extended position for servicing. When not being serviced, the component is moved to a rearwardly retracted operating position.

Each component of such a system generally includes cables that attach the component to power sources, communication networks, and other components. Each component generally includes at least one power cable that provides power to the component's power supply. Each component may also have cables connecting the unit with other components both inside and outside the rack. As an example, a rack-mounted computer system component may be coupled to a video monitor so that an operator may monitor the operation of the component or computer system. The component may also be coupled to a printer, a network adapter, a modem, and an external storage device, such as a disk drive, a RAID subsystem, optical disks, or a tape drive. Each of these connections often involves attaching a cable to the component These cabled connections are usually made at the back of the unit by connecting the cable to connectors provided on interface cards installed in the computer or to connectors provided on the back of the individual component. Components may also have communication cables that are connected to other components or to a communication port or outlet outside of the rack structure.

The large number of cables or wires coupled to each component and the large number of cables or wires within each rack may make it more difficult to move components within the rack. The components can often move or slide between a forwardly extended position and a rearwardly retracted position. The cables often include some slack so that the components can be slid to a forwardly extended position without causing the cables to snag or become disconnected. When a component is moved to a rearwardly retracted position, the excess or slack in the cable must be managed so that it does not become entangled with cables attached to other components that are above and below the particular component in the rearwardly retracted position.

Computers and other electronic components that are installed in a rack structure generate heat and must be cooled or must be prevented from overheating in order to ensure the proper operation of each component. Rack-mounted systems are typically cooled using the ambient room air. Ventilation is provided by air passing through the individual components, typically from the rear of the component to the front of the component. As such, it is desirable to organize the cables of a rack-mounted system to allow air flow through the individual components of the rack-mounted system to prevent overheating of a component. As computer and electronic components and systems become slimmer and more compact, the cables servicing the components must be organized in a manner that constrains the cables into a small volume while still allowing sufficient air flow to ventilate the system.

Rack hardware may include an extendable cable arm that is attached to the chassis of the slideable component at one end and attached to the rack on the opposite end. Cable arm assemblies mounted within the rack structure, such as the ones described in U.S. Pat. No. 6,070,742, incorporated herein by reference in its entirety, provide a framework to supply cables to a particular component. Typically, a cable arm servicing a component comprises several segments that are interconnected. A structure of this sort allows the cable arm to extend with the component as the component is extended into the forwardly servicing position and allows the cable arm to fold or collapse to accommodate the component when the component is moved to a rearwardly retracted operating position.

Techniques for supplying cables to a component via a cable arm assembly include fastening a bundle of cables to the cable arm assembly, using straps, such as VELCRO™ straps, or cable ties, such as those described in U.S. Pat. No. 5,131,613 and U.S. Pat. No. 4,805,856, each of which is incorporated herein by reference in its entirety. A drawback of these techniques is that the bundle of cables could substantially block the flow of ventilating air to the rack-mounted component. Another drawback of these techniques is that the cables may readily slide through the fastening devices. Thus, because of the force exerted on the cable when the cable arm is extended or retracted, the cable may not be controlled by the fastening devices. Because the cable is not controlled, there is the possibility of damage to the cable or component in the vicinity of the interface between the cable and the component or in the vicinity of the interface between the cable and a connection port Additionally, because the cables may slide, cables may accumulate when the cable arm assembly is in the retracted position, which may cause the cables to become entangled, to snag, or to become disconnected from the component when the cable is extended. Additionally, the accumulation of excess cables behind the component may cause further blockage of the flow of ventilating air. Furthermore, these techniques make it difficult to readily identify, remove, replace, or add a particular cable without the need to remove the component or all of the cables servicing the various components of the rack-mounted system.

Alternatively, cable arm assemblies may include hooks or ports that are integral or are attached to the cable arm. These hooks or ports support the cables supplied to a particular component These techniques include those described in U.S. Pat. No. 4,353,518 and U.S. Pat. No. 5,093,887, each of which is incorporated by reference in its entirety. The drawback of these techniques is that they do not permit a large number of cables to exist in a small area. As computer and electronic systems become slimmer and more compact, it is desirable to organize the cables and wires servicing the components of these system so that the servicing cables and wires use less vertical and horizontal space.

Other cable fasteners and devices for holding cables, such as clamps and hooks, may not provide an adequate system for organizing the cables in a dense configuration in a substantially flat, rectangular, cross-sectional area. Existing techniques may not provide the flexibility to position the cables in one of several positions. As such, the force exerted on the cable when the cable arm is extended or retracted may not be limited by the retaining devices in a manner that reduces the possibility of damage to the cable or component in the vicinity of the interface between the cable and the component or in the vicinity of the interface between the cable and a connection port. Additionally, because cables may readily slide, cables may accumulate when the cable arm assembly is in the retracted position, causing the cables to become entangled, to snag, or to become disconnected from the component when the cable is extended.

SUMMARY OF THE INVENTION

In accordance with the present disclosure, disclosed system and method for managing cables and wires supplied to components of a rack-mounted computer or electronic system provides significant advantages over current cable management techniques and devices.

The disclosed cable management system includes a cable retainer for holding cables in conjunction with a cable arm or other receiving structure. The cable retainer includes a platform and prongs that extend from the platform. Each prong includes a stem that terminates in a tapered projection. The tapered projections of the prongs of the cable retainer are spaced a distance apart. The cable is retained in the cavity that is bounded by the platform, the stems of the prongs, and the tapered projection of the prongs. The cable retainer may also include a fastener for coupling the cable retainer to a support or other receiving structure.

The cable retainer of the present disclosure may be coupled to any suitable receiving structure, including a cable arm. The cable arm of the present disclosure is a pivotable, collapsible arm that is coupled between a rack and a component. The cable retainers are coupled to the cable arm, and the cable or wire is routed through the cable retainers of the cable arm to permit the cable arm to be coupled between the rack and the component. As the component is moved in the rack between a servicing position and an operating position, the cable arm extends and collapses, as appropriate, while retaining the cable or wires of the component in the cable retainers of the cable arm. The cable arm includes support having slots formed therein for receiving fasteners that couple the cable retainer to the cable arm. The slots of the cable arm are sized in a manner to permit cable retainers to be positioned adjacent to one another on the cable arm.

A technical advantage of the present disclosure is a cable management system that firmly retains the cable, while permitting movement of a component between one of two positions in a manner that prevents the cable from being pinched or severed. Another technical advantage of the present disclosure is the ability to couple a number of cables between a rack and a component, while maintaining spacing between the cables to permit air flow to the area of the cable arm and the area of the component. The present disclosure provides a cable management system that is able to constrain a number of cables in a small volume such that the cable arm of the cable management system can accommodate slimmer and more compact rack-mounted components.

Another technical advantage of the present disclosure is a cable management system in which cables can be identified, removed, or replaced easily. The cable arm positions the cables so that they can be easily identified without the necessity of removing the component from the rack or removing all the cables from the component. The cable retainers themselves, because of their material flexibility, permit the easy installation and removal of cables from the cavity of the cable retainer. The cable arm and cable retainers of the present disclosure can accommodate cables of varying number, size, and stiffness.

Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
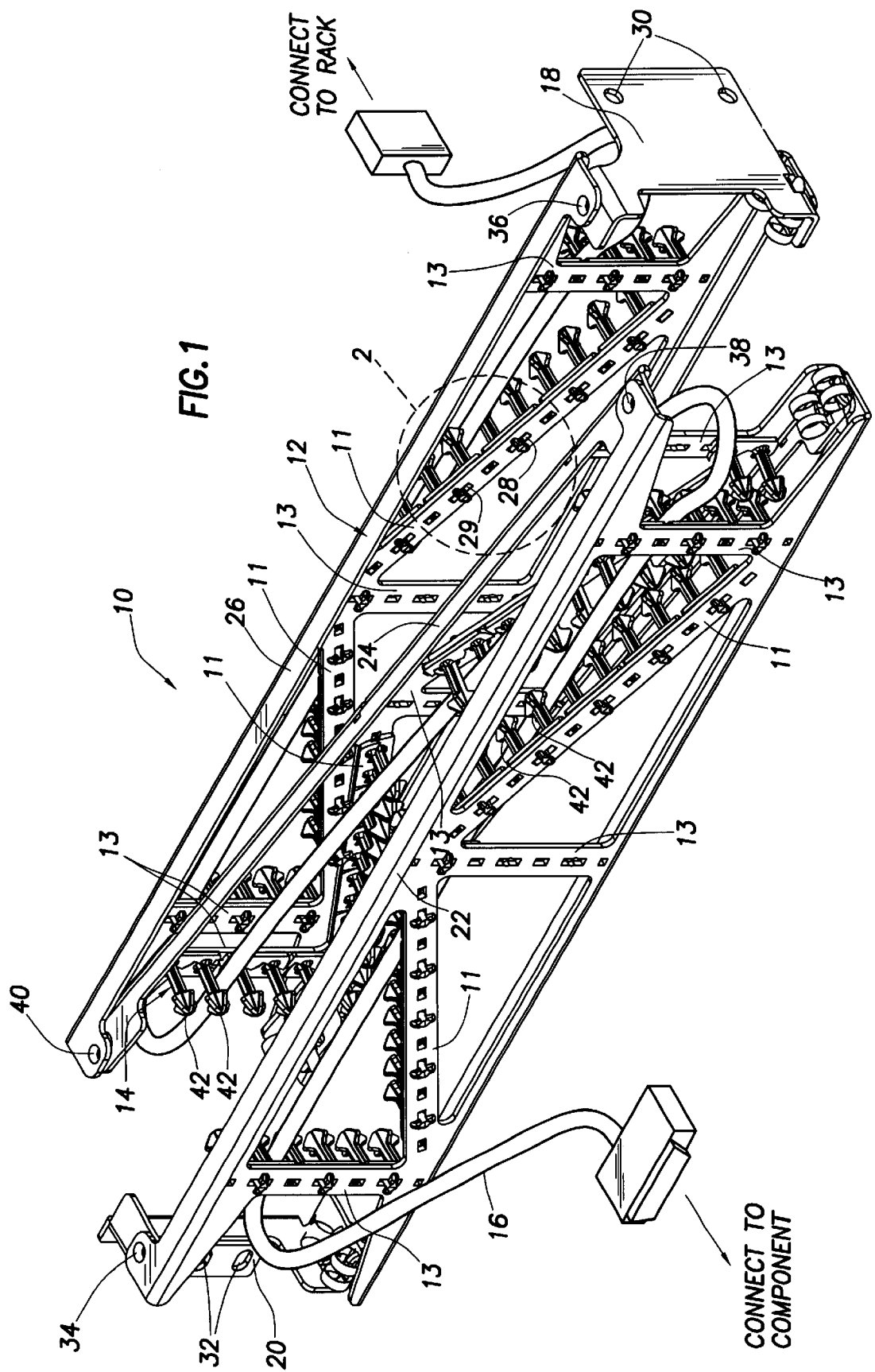
FIG. 1 is a perspective view of one embodiment of the cable management system including the cable arm, the cable retainers, and a cable.

The present disclosure is directed to a system for managing cables and wires that are coupled to components of rack-mounted computer or electronic systems. Shown in FIG. 1 is a cable management system, which is indicated generally at 10. Cable management system 10 includes a cable arm 12 and cable retainers 14, which are coupled to and hold a cable 16. Although only one cable 16 is shown in FIG. 1, the cable management system of the present disclosure can accommodate and manage several cables simultaneously. The cables managed by cable management system 10 may be of varying stiffness and size.

Cable arm 12 includes at least two interconnected segments that permit cable arm 12 to extend with a rack-mounted component as the component is extended into the forwardly servicing position and that allow the cable aim to fold or collapse to accommodate the component when the component is moved to a rearwardly retracted operating position. Multiple segments are necessary to permit the segments to pivot about one another to accommodate the movement of the rack-mounted component. Although a cable arm may be assembled with as little as two segments, cable arm 12 of FIG. 1 is assembled from three segments: a component segment 22; an intermediate segment 24; and a rack segment 26. Component segment 22 is the segment of cable arm 12 that is coupled to the rack-mounted component Rack segment 26 is the segment of cable arm 12 that is coupled to the rack. Intermediate rack 24 is between and coupled to each of component segment 22 and rack segment 26. Each of component segment 22, intermediate segment 24, and rack segment 26 includes vertical supports 13 and diagonal supports 11.

Rack segment 26 of cable arm 12 terminates at rack attachment plate 18. A rack (not shown) is coupled to cable arm 12 at rack attachment plate 18. The connection between rack attachment plate 18 and the rack may be made with fasteners, such as screws, and the apertures 30 of rack attachment plate 18. Component segment 22 of cable arm 12 terminates at component attachment plate 20. A component (not shown) is coupled to cable arm 12 at component attachment plate 20. The connection between component attachment plate 20 and the component may be made with fasteners, such as screws, and the apertures 32 of component attachment plate 20. Component attachment plate 20 and rack attachment plate 18 are at opposite ends of cable arm 12. Component segment 22 is pivotally attached to component attachment plate 20 by hinge 34. Rack segment 26 is pivotally attached to rack attachment plate 18 using hinge 36. Component segment 22 is pivotally attached to intermediate segment 24 by hinge 38. Intermediate segment 24 is pivotally attached to rack segment 26 by hinge 40. The hinged attachment of component attachment plate 20 to rack attachment plate 18 permits cable arm 12 to extend or fold according to the position of the component in the rack. When the component is extended into the forwardly servicing position, cable arm 12 extends in a substantially straight line. When the component is moved to a rearwardly retracted operating position, segments 22, 24, and 26 of cable arm 12 pivot about themselves so that the segments fold or collapse into a Z shape to accommodate the retracted component.

Cable arm 12 includes cable retainers 14. Cable retainers 14 are coupled to cable arm 12 at slots 28 and 29 of diagonal supports 11 and horizontal supports 13 of segments 22, 24, and 26. Although cable retainers 14 are described herein with reference to cable arm 12, cable retainers 14 need not be used exclusively in conjunction with cable arm 12. Rather, cable retainers 14 may be, used in any structure that includes the mating geometry to receive the cable retainer, including any chassis, rack, or other suitable structure that includes suitable mating geometry. Each cable retainer 14 includes a pair of retainer prongs 42.

Shown in FIG. 1 is cable 16 as it travels through cable arm 12. In the cable management system 10 of FIG. 1, cable arm 12 enters rack segment 26 from the back of rack (not shown). As cable 16 travels through cable arm 12, cable 16 is inserted into and retained between cable retainer prongs 42. Each of prongs 42 generally has the same structure, and adjacent prongs are offset a distance apart to permit easy insertion of cable 16 between adjacent prongs 42. A pair of adjacent cable retainer prongs 42 located on cable arm 12 may both be part of a single cable retainer 14. As an alternative, an adjacent pair of cable retainers 42 located on cable arm 12 may each be part of separate, but adjacent, cable retainers 14. It should be recognized that varying numbers of cable retainers 14 may be coupled to cable arm 12 to accommodate the number of cables that may be routed through cable arm 12.

Figure 2:
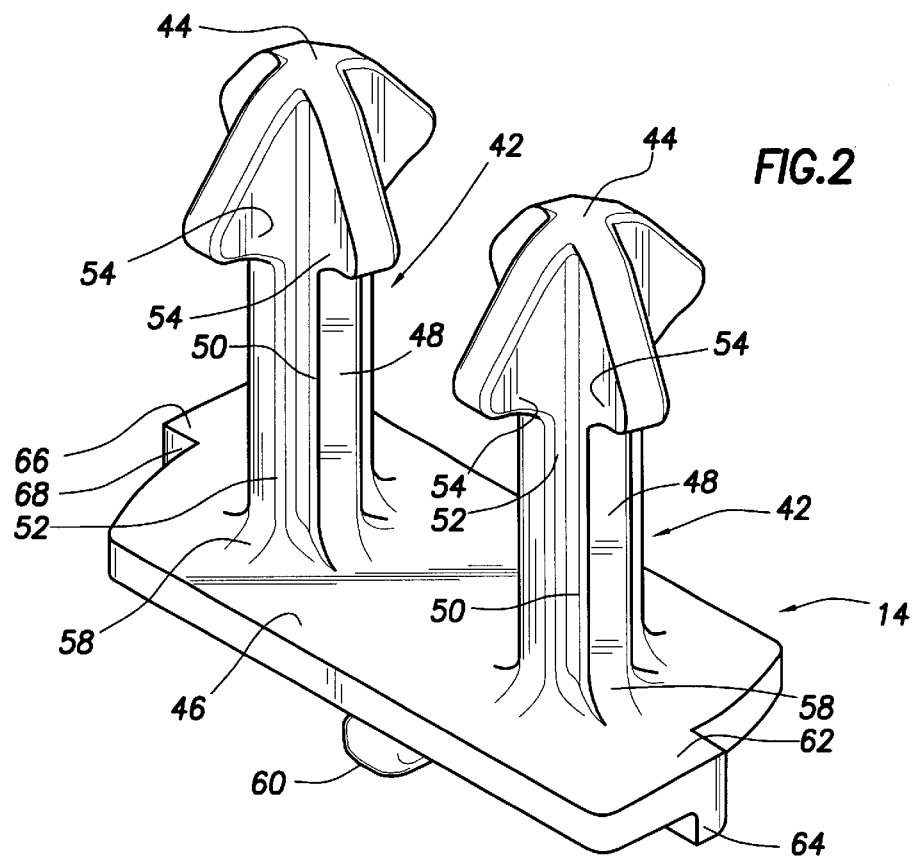
FIG. 2 is a top perspective view of an embodiment of a cable retainer.
Figure 3:
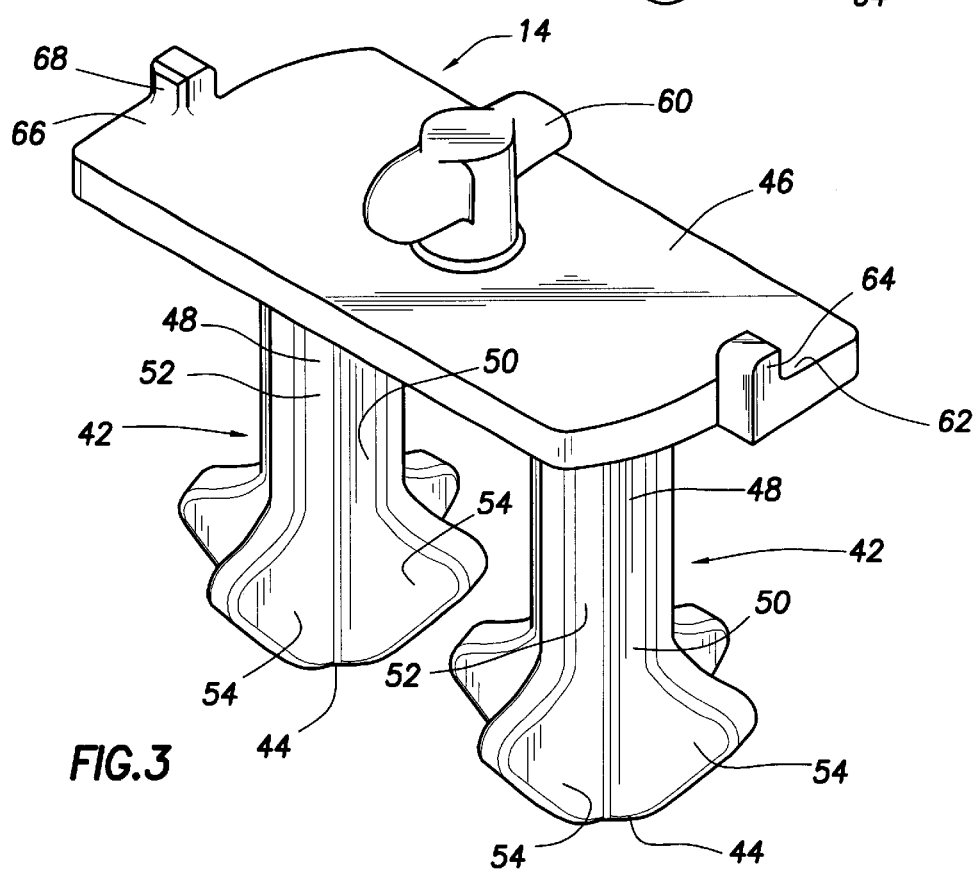
FIG. 3 is a bottom perspective view of a cable retainer.

As shown in the depiction of a top view of cable retainer 14 of FIG. 2, each cable retainer 14 includes two retainer prongs 42. FIG. 3 depicts a bottom view of cable retainer 14. Cable retainers 14 retain cable 16 by holding cable 16 between a platform 46 and the four tapered or arrowhead-shaped projections 54 of each prong 42. Prongs 42 are offset a selected distance so that cable retainer 14 can hold one or more cables of varying stiffness and size. Although the cable retainer of FIGS. 2 and 3 includes only two prongs, it should be recognized that a cable retainer may contain three or more prongs depending on the cable retention requirements of the rack, chassis, or component whose cables are being retained by the cable retainer of the present disclosure. Prongs 42 extend outwardly from platform 46. Stem 48 includes adjacent plates 50 and 52 that terminate in arrowhead-shaped projections 54. The intersection of each of the four arrowhead-shaped projections 54 of each of prongs 42 is tapered protrusion 44. Tapered protrusion 44 may include a flat plateau that is substantially parallel to platform 46. As an alternative to a flat plateau at the most extreme point of tapered protrusion 44, tapered protrusion 44 may include a rounded tip at its most extreme point.

Platform 46 includes lips 62 and 66 at opposite ends of platform 46. A latch 64 extends beneath lip 62, and, as shown in FIG. 3, a latch 68 extends beneath lip 66. Latches 64 and 68 are approximately perpendicular to the plane of platform 46. Lips 62 and 66 and latches 64 and 68 secure cable retainer 14 to a receiving structure, such as cable arm 12. As shown in FIG. 3, a T-shaped lock 60 extends from beneath platform 46. T-shaped lock 60 is pivotable around its base to provide a structure for locking cable retainer 14 into the slots of cable arm 12. Stem 48 of prongs 42 are attached to platform 46 at a base 58. Base 58 may be curved to minimize the concentration of mechanical stress and strain at the attachment of base 58 and platform 46. The slope or form of the curvature may vary depending on the mechanical forces expected to be experienced by cable retainer 14.

Figure 4:
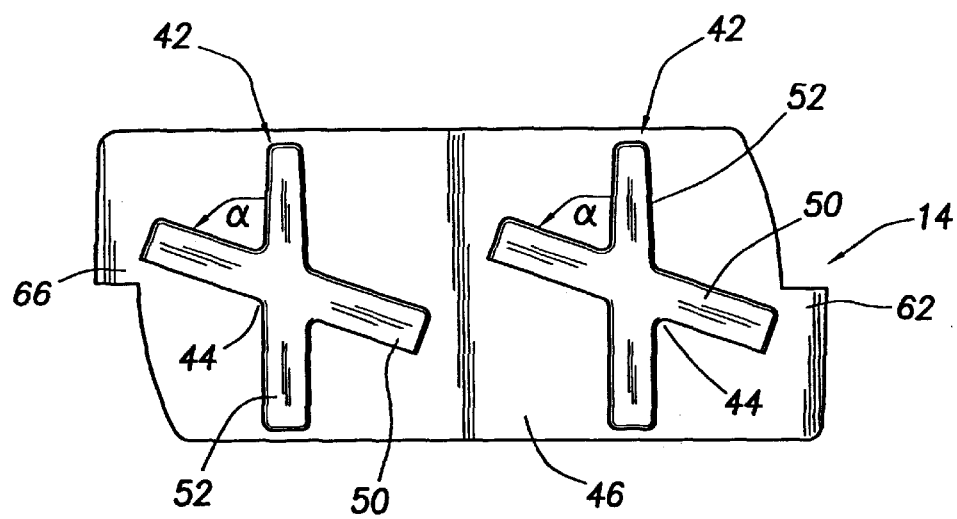
FIG. 4 is top a elevation of a cable retainer.
Figure 5:
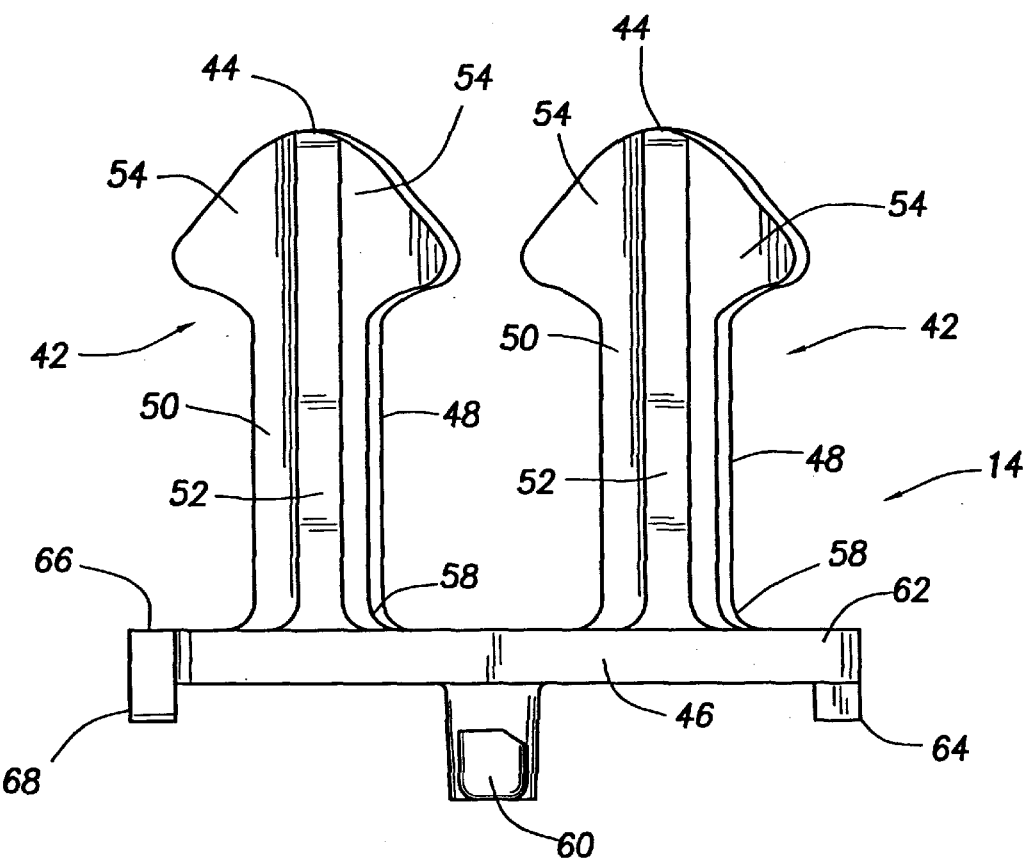
FIG. 5 is a side elevation view of a cable retainer.

Shown in FIG. 4 is a top view of the intersection of first plate 50 and second plate 52 to form the four arrowhead-shaped projections 54 of each prong 42. First plate 50 and second plate 52 intersect at an angle α, which may range from about 45 degrees to about 85 degrees, depending upon the size, stiffness, and number of cables 16 to be retained by cable retainer 14. FIG. 5 is a side view of cable retainer 14.

The placement of cable 16 in cable arm 12 is shown in FIG. 1. Cable 16 is extended along the length of rack segment 26 and is inserted between various pairs of prongs 42 of cable retainers 14. After cable 16 is extended along the length of rack segment 26 and inserted between various pairs of prongs 42 to position cable 16 as desired, cable 16 is wrapped around rack segment 26 and inserted between a pair of prongs 42 extending outwardly from intermediate segment 24. Cable 16 is extended along the length of intermediate segment 24 and inserted between prongs 42 and behind the arrowhead-shaped projections 54 of each prong. After cable 16 is extended along the length of intermediate segment 24 and inserted between various pairs of prongs 42 to position cable, 16 as desired, cable 16 is wrapped around intermediate segment 24 and inserted between a pair of prongs 42 extending outwardly from component segment 22. Similarly, cable 16 may be extended along the length of component segment 22 and inserted between various pairs of prongs 42 to position cable 16 as desired. Cable 16 may then exit cable arm 12 to attach to a rack-mounted component (not shown).

Figure 6:
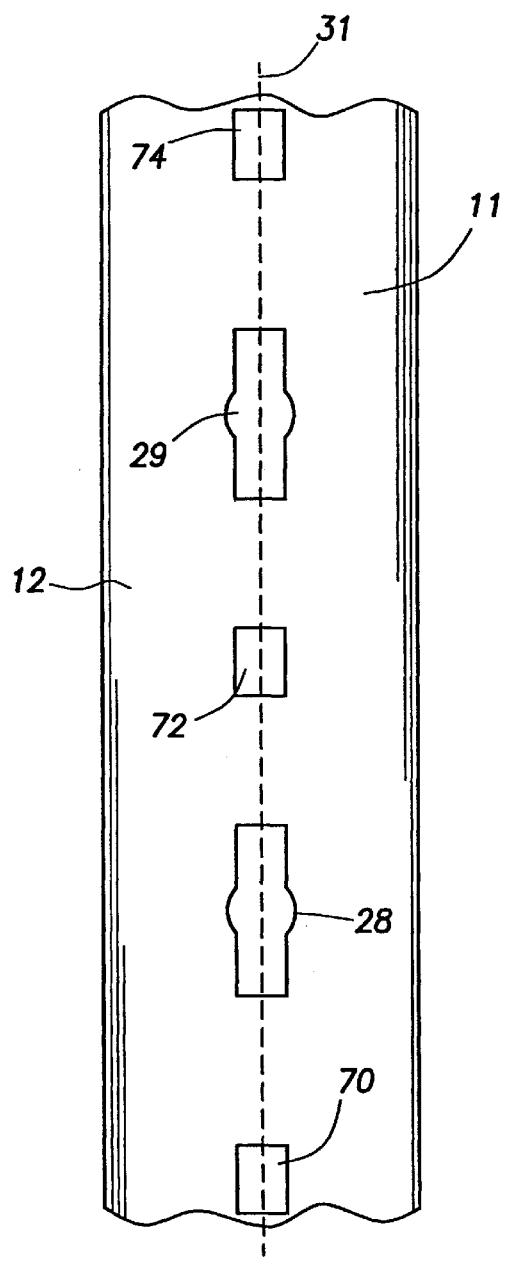
FIG. 6 is a detail view of a diagonal support of FIG. 1.
Figure 9:
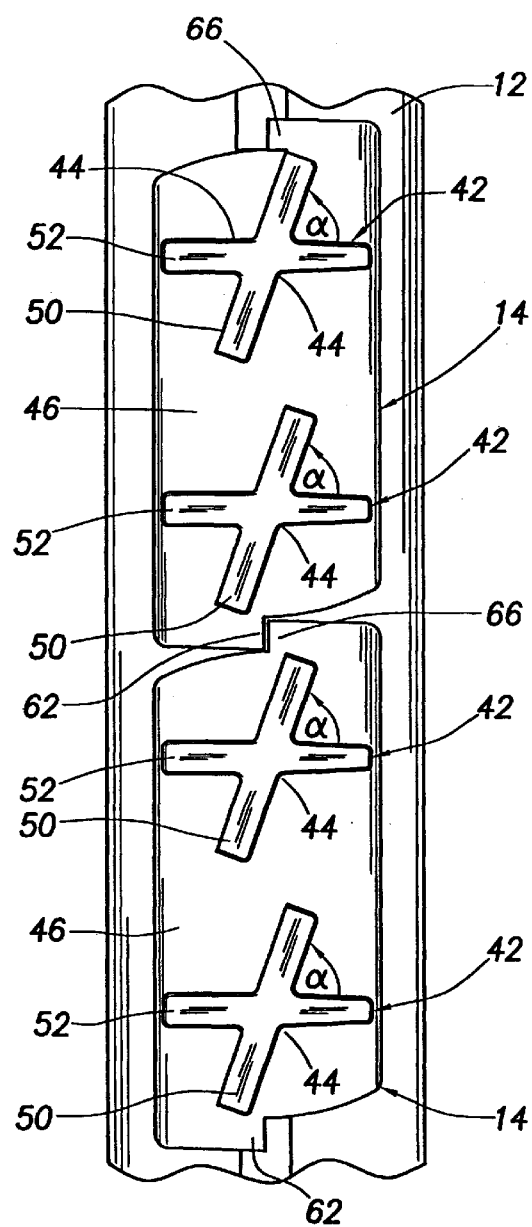
FIG. 9 is a top elevation of two interlocking cable retainers.

FIG. 6 is a detail view of a diagonal support 11 of cable arm 12 of FIG. 1. Cable retainers 14 are not shown in the detail view of FIG. 6. Diagonal support 11 includes longitudinal slots 28 and 29, which are sized to receive the T-shaped lock 60 of cable retainers 14. Diagonal support 11 also includes intermediate slots 70, 72, and 74. Cable retainer can be coupled to diagonal support 11 by inserting T-shaped lock 60 into slot 28. Once inserted, T-shaped lock 60 is pivoted so that T-shaped lock 60 is perpendicular to the length of longitudinal slot 28, thereby holding the lock and cable retainer 14 in place. Latch 64 snaps into intermediate slot 70, and latch 68 snaps into intermediate slot 72. In this manner, cable retainer 14 is held in place at three points: T-shaped lock 60, latch 64, and latch 68. Each of intermediate slots 70, 72, and 74 is wide enough to accommodate the latches 64 or 68 of adjacent cable retainers 14. As such, each of intermediate slots 70, 72, and 74 may receive latches from adjacent cable retainers 14. A top view of interlocking and adjacent cable retainers 14 is shown in FIG. 9. Latches 64 and 68 are associated with adjacent lips 62 and 66 of cable retainers 14. Lips 62 and 66 interlock to fit within a single intermediate slot 72 (not shown on FIG. 9).

Figure 7:
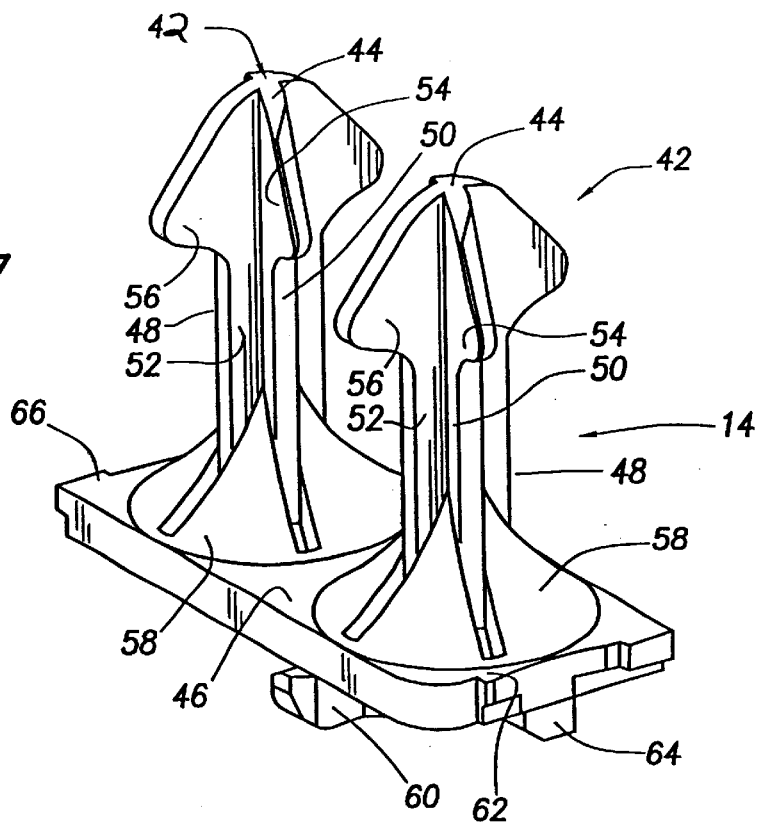
FIG. 7 is a top perspective view of an embodiment of a cable retainer.
Figure 8:
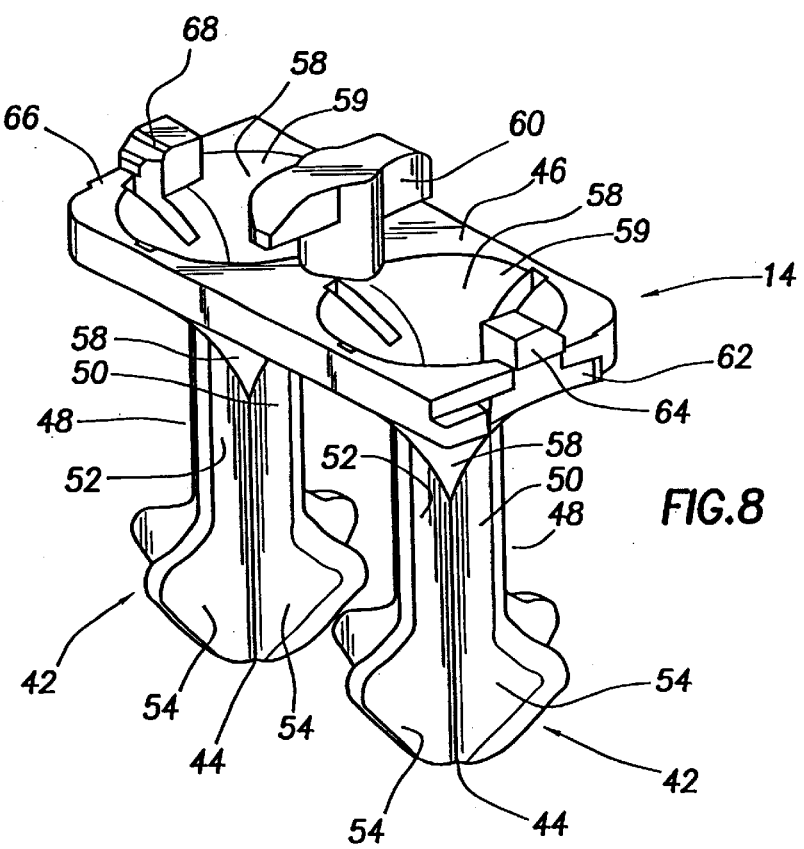
FIG. 8 is a bottom perspective view of an embodiment of a cable retainer.

Another embodiment of cable retainer 14 is shown in FIGS. 7 and 8. Prongs 42 of cable retainer 14 of FIGS. 7 and 8 include a base 58 that includes concave portion on the side of platform 46 with T-shaped lock 60. The concave portion 59 is formed by the triangular portions of base 58. The curvature of base 58 provides mechanical support to cable retainer 14, and the concave portion 59 of base 58 reduces the weight and space requirements of cable retainer 14.

Figure 10:
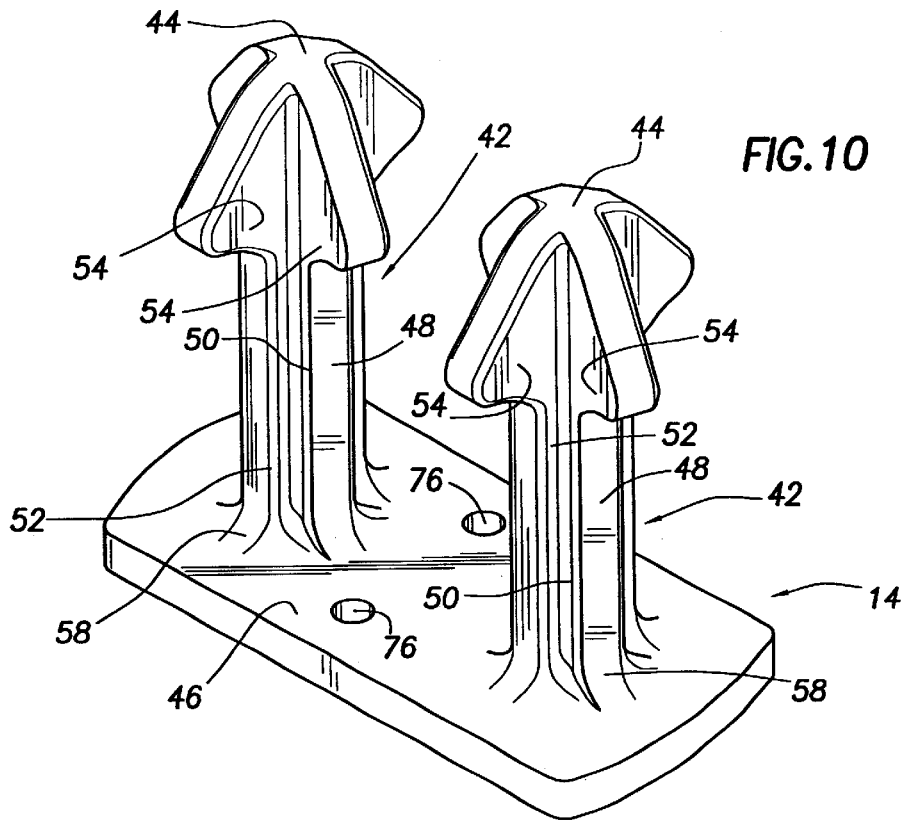
FIG. 10 is a top perspective view of an embodiment of a cable retainer.
Figure 11:
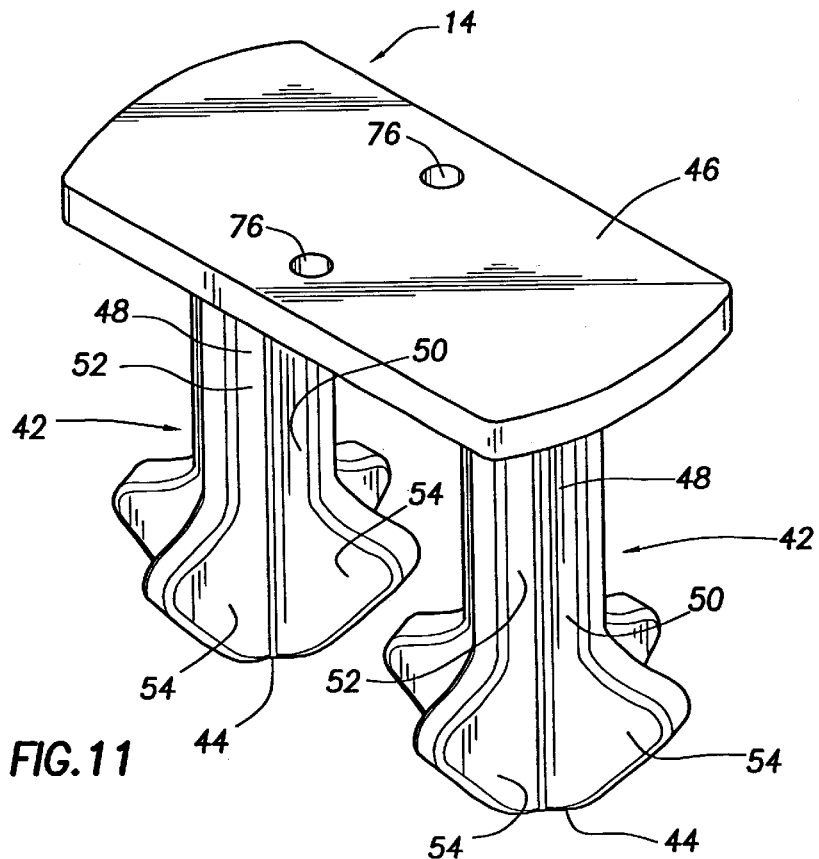
FIG. 11 is a bottom perspective view of an embodiment of a cable retainer.

Another embodiment of cable retainer 14 is shown in FIGS. 10 and 11. The cable retainer of FIGS. 10 and 11 includes a pair of apertures 76 that extend through platform 46. Apertures 76 provide an attachment base for coupling cable retainer 14 to a cable arm. Cable retainer 14 may be coupled to a cable arm 12 at apertures 76, using a suitable fastener, including any combination of nails, screws, staples, adhesives, mounting tapes, or other methods. As an alternative, the cable retainer of the present disclosure may be coupled to a cable arm or other structure without the necessity of apertures 76 using any suitable fastener.

Cable retainer 14 may be composed of any flexible material, including plastic, elastomer, vinyl, nylon, rubber, or a blend of any of the aforementioned constituents. The material of manufacture should be sufficient to permit cable retainer 14 to flex slightly to accept cable 16 between the prongs 42. The material of manufacture should be chosen with reference to ease and cost of manufacture.

It should be recognized that cable retainer 14 need not be used exclusively with the cable arm 12 of FIG. 1. Rather, one or more cable retainer 14 can be coupled to any device to which cables should be retained. The cable retainer and cable management system disclosed herein provides a system and method for retaining a cable coupled to a rack-mounted electronic component. The cable retainer and cable management system disclosed herein permits the component to be moved between one of two positions while keeping the cable connected to the component firmly retained, while preventing the cable from being pinched or severed by movement of the component. The cable management system also provides a method for the spacing and coupling of a number of cables of varying size and stiffness and the ability to manipulate each cable individually. The compact design of the cable management system permits the system to accommodate components having space constraints.

Although the present disclosure has been described in detail, it should be understood that various changes, substitutions, and alterations can be made hereto without departing from the spirit and the scope of the invention as defined by the appended claims.

What is claimed is:

1. A cable retainer, comprising:
   a platform having a first and second side;
   first and second prongs extending from a first side of the platform, each prong having two intersecting plates forming a selected angle of not greater than about 85 degrees therebetween, each prong having a stem terminating in a tapered projection, wherein the prongs are spaced a distance from one another and form a cavity bounded by the first side of the platform and the stem and the tapered projection of each prong.

2. The cable retainer of claim 1, wherein the stems of the prongs extend substantially perpendicularly from the first side of the platform.

3. The cable retainer of claim 1, wherein the tapered projection of each prong comprises a plurality of tapered projections, each disposed around the circumference of the stem of the prong.

4. The cable retainer of claim 2, wherein the tapered projection of each prong comprises four tapered projections.

5. The cable retainer of claim 1, further comprising a fastener coupled to the second side of the platform.

6. The cable retainer of claim 5,
   wherein the platform includes first and second ends; and
   wherein the fastener comprises a first latch extending from the first end of the platform and a second latch extending from the second end of the platform.

7. The cable retainer of claim 5, wherein the retainer is comprised of an organic polymeric material.

8. The cable retainer of claim 5, wherein the retainer is comprised of a nylon material.

9. A cable management system comprising:
   a cable arm; and
   a cable retainer, the cable retainer comprising,
      a platform having a first and second side;
      first and second prongs extending from a first side of the platform, each prong having two intersecting plates forming a selected angle of not greater than about 85 degrees therebetween, each prong having a stem terminating in a tapered projection, wherein the prongs are spaced a distance from one another and form a cavity bounded by the first side of the platform and the stem and the tapered projection of each prong.

10. The cable management system of claim 9, wherein the stems of the prongs of the cable retainer extend substantially perpendicularly from the first side of the platform.

11. The cable management system of claim 9, wherein the tapered projection of each prong of the cable retainer comprises a plurality of tapered projections, each disposed around the circumference of the stem of the prong.

12. The cable management system of claim 9,
   wherein the cable retainer further comprises a fastener extending from the second side of the platform at a selected location; and
   wherein the cable arm includes a support having a slot therein that is sized to receive the fastener.

13. The cable management system of claim 14,
   wherein the platform of the cable retainer includes first and second ends;
   wherein the fastener includes a first latch extending from the first end of the platform and a second latch extending from the second end of the platform; and
   wherein the cable arm includes a support having slots therein that are sized to received the first latch and the second latch.

14. The cable management system of claim 12, wherein the platform of the cable retainer includes first and second ends;

wherein a first lip extends from the first end approximately parallel to the platform and a second lip extends from the second end approximately parallel to the platform, each lip being configured to mate with a lip of an adjacent cable retainer;

wherein the fastener includes a first latch extending from the first lip approximately perpendicular to the platform and a second latch extending from the second lip approximately perpendicular to the platform; and wherein the slots that are sized to receive the first latch and the second latch are sufficiently large to accommodate latches of adjacent cable retainers.

15. A method for threading a cable through a cable retainer, comprising the steps of:

providing a cable retainer, the cable retainer comprising,
a platform having a first and second side;
first and second prongs extending from a first side of the platform, each prong having two intersecting plates forming a selected angle of not greater than about 85 degrees therebetween, each prong having a stem terminating in a tapered projection, wherein the prongs are spaced a distance from one another and form a cavity bounded by the first side of the platform and the stem and the tapered projection of each prong; and threading a cable through the cable retainer such that the cable is retained in the cavity bounded by the first side of the platform and the stem and the tapered projection of each prong.

16. The method for threading a cable retainer of claim 15, wherein the tapered projection of each prong of the cable retainer comprises a plurality of tapered projections, each disposed around the circumference of the stem of the prong.

17. The method for threading a cable retainer of claim 15, wherein the stems of the prongs of the cable retainer extend substantially perpendicularly from the first side of the platform.

18. The cable retainer of claim 5, wherein the fastener comprises a pivotable lock.

19. The cable management system of claim 12, wherein the fastener further includes a pivotable lock; and wherein the cable arm includes a support having a slot therein that is sized to receive the pivotable lock.

20. The cable management system of claim 14, wherein the fastener further includes a pivotable lock; and wherein the cable arm includes a support having a slot therein that is sized to receive the pivotable lock.

* * * * *